United States Patent
Bergin et al.

(10) Patent No.: US 11,875,090 B2
(45) Date of Patent: *Jan. 16, 2024

(54) BUILDING INFORMATION DESIGN SYNTHESIS (BIDS)

(71) Applicant: Autodesk, Inc., San Rafael, CA (US)

(72) Inventors: Michael S. Bergin, El Cerrito, CA (US); Chin-Yi Cheng, Walnut Creek, CA (US); Mehdi Nourbakhsh, Richmond, CA (US)

(73) Assignee: AUTODESK, INC., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/681,150

(22) Filed: Feb. 25, 2022

(65) Prior Publication Data

US 2022/0180017 A1    Jun. 9, 2022

Related U.S. Application Data

(63) Continuation of application No. 16/254,083, filed on Jan. 22, 2019, now Pat. No. 11,263,360.

(60) Provisional application No. 62/619,555, filed on Jan. 19, 2018.

(51) Int. Cl.
| | | |
|---|---|---|
| *G06F 30/13* | (2020.01) | |
| *G06F 3/04883* | (2022.01) | |
| *G06N 5/022* | (2023.01) | |
| *G06N 3/08* | (2023.01) | |
| *G06F 16/22* | (2019.01) | |

(52) U.S. Cl.
CPC .......... *G06F 30/13* (2020.01); *G06F 3/04883* (2013.01); *G06N 5/022* (2013.01); *G06F 16/2228* (2019.01); *G06N 3/08* (2013.01)

(58) Field of Classification Search
None
See application file for complete search history.

(56) References Cited

U.S. PATENT DOCUMENTS

| | | |
|---|---|---|
| 2013/0262041 A1 | 10/2013 | Fu et al. |
| 2014/0267717 A1 | 9/2014 | Pitzer et al. |
| 2018/0307189 A1 | 10/2018 | Viehweider et al. |

FOREIGN PATENT DOCUMENTS

EP    3506211    7/2019

OTHER PUBLICATIONS

Funkhouser, T., et al., "A Search Engine for 3D Models", ACM Transactions on Graphics, Jan. 2003, pp. 83-105, vol. 22, No. 1.
Eitz, M., et al., "Sketch-Based Shape Retrieval", ACM Transactions on Graphics, Jul. 2012, pp. 1-10, vol. 31, No. 4.

(Continued)

*Primary Examiner* — Syed A Roni
(74) *Attorney, Agent, or Firm* — Gates & Cooper LLP

(57) ABSTRACT

A method, apparatus, system, and computer program product provide the ability to dynamically generate a digital building information model. Design data for various designs is received. The design data for each design is encoded into a graph. A knowledge base is maintained and defines a model of design intent while processing and storing the graph. First user input of a goal or constraint is received. The knowledge base generates solutions based on the input. Second user input based on the solutions is received and used to iteratively train the knowledge base. The solutions are then output.

20 Claims, 17 Drawing Sheets

(56) References Cited

OTHER PUBLICATIONS

Hou, S., et al., "Sketch-based 3D Engineering Part Class Browsing and Retrieval", EUROGRAPHICS Workshop on Sketch-Based Interfaces and Modeling, Jan. 2006, pp. 131-138.

Nishida, G., et al., "Interactive Sketching of Urban Procedural Models", ACM Transactions on Graphics, Jul. 2016, pp. 1-11, vol. 35, No. 4.

Schneider, R.G., et al., "Sketch Classification and Classification-driven Analysis using Fisher Vectors", Nov. 2014, pp. 1-9, ACM Transactions on Graphics, vol. 33, No. 6.

Su, H., et al., "Multi-view Convolutional Neural Networks for 3D Shape Recognition", 2015 IEEE International Conference on Computer Vision, pp. 945-953.

Wang, F., et al., "Sketch-based 3D Shape Retrieval using Convolutional Neural Networks", 2015 IEEE Conference on Computer Vision and Pattern Recognition (CVPR), 2015, pp. 1875-1883.

BUILDING INFORMATION DESIGN SYNTHESIS (BIDS)

CROSS-REFERENCE TO RELATED APPLICATIONS

This application is a continuation under 35 U.S.C. § 120 of application Ser. No. 16/254,083 (now U.S. Pat. No. 11,263,360, filed on Jan. 22, 2019 (issued on Mar. 1, 2022), with inventor(s) Michael S. Bergin, Chin-Yi Cheng, and Mehdi Nourbakhsh, entitled "Building Information Design Synthesis (BIDS)," which application is incorporated by reference herein, and which application claims the benefit under 35 U.S.C. Section 119(e) of the following commonly-assigned U.S. provisional patent application(s), which is/are incorporated by reference herein: Provisional Application Ser. No. 62/619,555, filed on Jan. 19, 2018, with inventor(s) Michael S. Bergin, Chin-Yi Cheng, and Mehdi Nourbakhsh, entitled "Building Information Design Synthesis (BIDS)".

BACKGROUND OF THE INVENTION

1. Field of the Invention

The present invention relates generally to design and construction, and in particular, to a method, system, apparatus, and article of manufacture for generating and optimizing a building information model (BIM) (e.g., a detailed design model/floor plan) in real time based on conceptual design input (e.g., a sketch or bubble diagram).

2. Description of the Related Art

Building Information Modeling (BIM) is an intelligent 3D model-based process that provides architecture, engineering, and construction (AEC) professionals the insight and tools to more efficiently plan, design, construct, and manage buildings and infrastructure. Through BIM, a digital 3D model is created that includes data associated with physical and functional characteristics. The data in a BIM model defines the design elements and establishes behavior and relationships between model components. Further, BIM provides insight into a design's constructability thereby improving the efficiency and effectiveness of the construction phase, while also providing a better understanding of the building's future operations and maintenance.

Prior art BIM systems are not designed for or desirable for use at the early design stage. For example, when a designer is at the very early stage of sketching out a building (e.g., on the back of a napkin or a quick sketch on a sheet of paper), a BIM model is not desirable as it would require information that extends well beyond the conceptual sketches that the designer creates. Nonetheless, as a design advances from concept to implementation/construction, it is desirable for a designer to have the ability to begin the design process at the high conceptual level while retaining the ability to utilize a BIM model as the design progresses.

FIG. 1 illustrates some of the problems with the prior art design process and the gaps between the different building representations. The concept-to-construction process is often iterative where a designer may desire to move back and forth between different building representations such as a sketch 102, CAD/3D design 104, and/or BIM model 106. However, redrawing an original sketch 102 can be a time-consuming process. In addition, transitioning from a sketch 102 to a CAD/3D design 104 and then to a BIM model may also be time-consuming. As illustrated, the prior art is deficient and lacks the ability to move between the representations 102-106 easily and in an automated manner. Further, once the process advances through the development process, it may not be possible to change the BIM model 106, and as a result, the process must return back to the original sketch 102. Accordingly, the prior art also lacks the ambiguity and flexibility to move between the different representations 102-106.

SUMMARY OF THE INVENTION

For architects, engineers, contractors, and building owners who seek to improve their design and construction process, embodiments of the invention overcome the problems of the prior art by providing a system that uses artificial intelligence (AI)/machine learning (ML) to synthesize functional building designs, documentation, analytics, and construction planning from requirements and design input provided by building stakeholders. Unlike existing tools, embodiments of the invention support the production of buildings by providing an interactive and generative design system that accepts natural design input such as sketches, diagrams, and natural language, and produces multiple alternatives that meet the requirements collectively defined by the design team/building stakeholders. Further, the AI/ML capabilities generate and adapt a knowledge base system that becomes more responsive to the designer and produces more relevant solutions over time.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

Embodiments of the invention improve value returned from customer subscriptions by progressively building a knowledge base, a formal representation of the subscriber's intent throughout the design and construction process that grows more accurate over time. The improved understanding provides progressively greater value in the form of predictions and risk assessments, user efficiencies, decision support and improvements in the formal retention and reuse of knowledge. As used herein, embodiments of the invention may be referred to as BIDS (Building Information Design Synthesis).

One element that distinguishes BIDS from industry standard design applications in use today is the workflow. In prior art BIM tools, the designer or drafter directly models the building project. By contrast, in BIDS, the building stakeholders define a model of design intent that is used by the system to "render" documentation, planning documents and project analyses on demand. The mature state of this system enables unprecedented change management in complex building projects.

Another element of the BIDS system is an encoder/decoder that is built through the collection and analysis of precedent examples. The BIDS system analyzes and decodes example projects provided to the system across the entire project workflow. One component in this process is the BIDS training system, where BIDS develops a functional representation of a given class of design and construction approaches that is specific to the customer and augmented by the general BIDS knowledge base. This training model serves as an inference model that translates input for new design projects into actionable design models, documentation and analytical data. The BIDS research system architecture supports these user interactions and functions throughout the design and construction process. The BIDS system provides a unifying platform for deep transfer and reinforcement learning research for a built environment.

System Architecture

Figure 1:
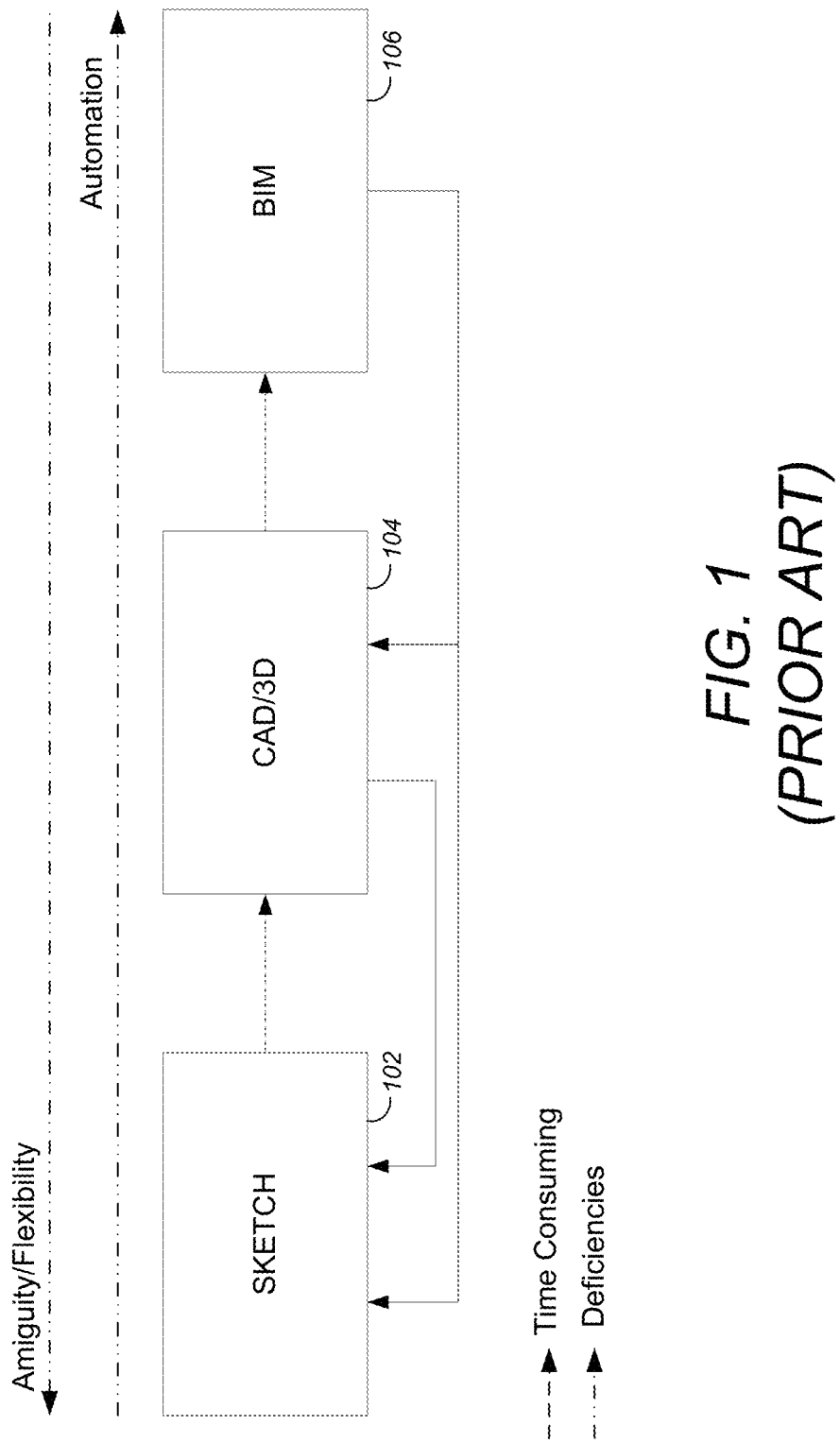
FIG. 1 illustrates some of the problems with the prior art design process and the gaps between the different building representations.
Figure 2:
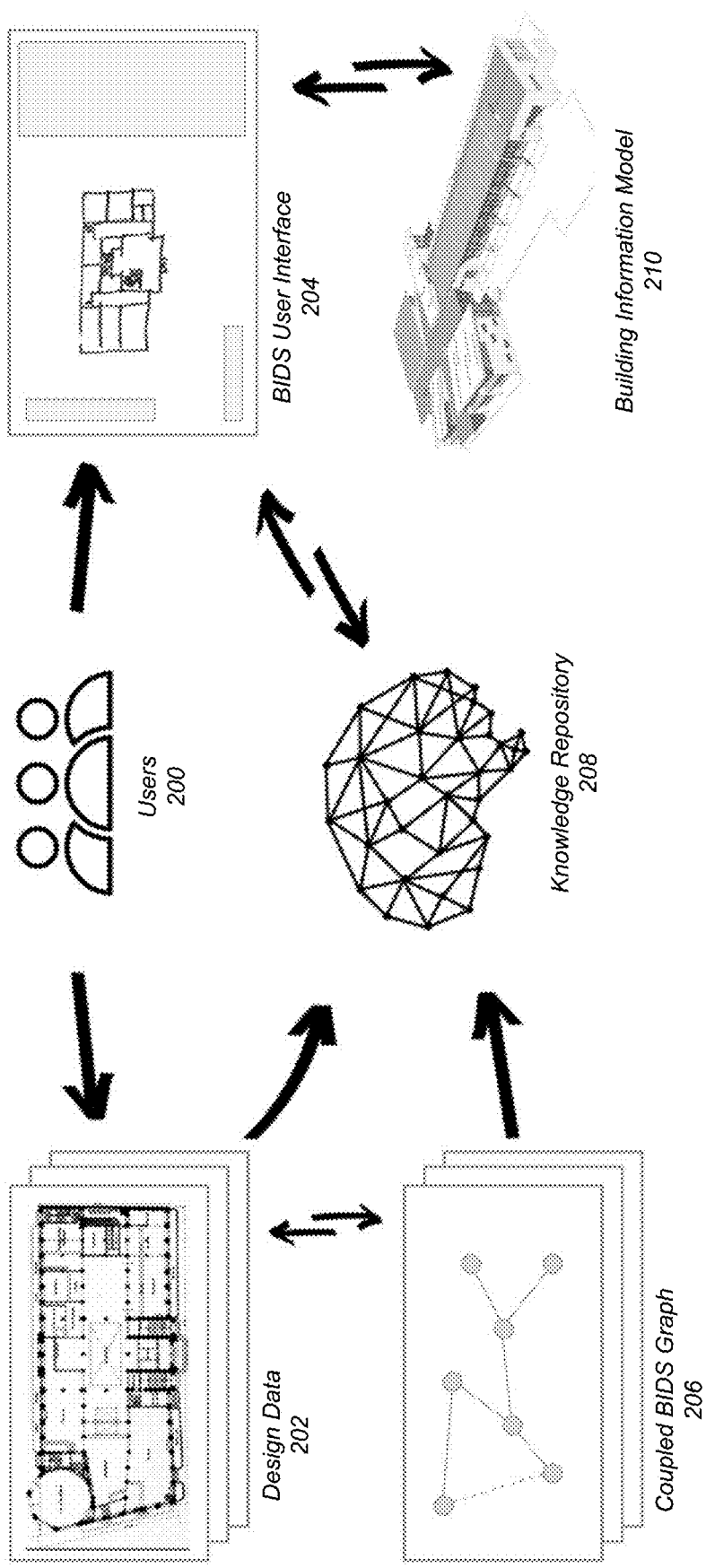
FIG. 2 illustrates the system architecture for a BIDS system in accordance with one or more embodiments of the invention.

FIG. 2 illustrates the system architecture for a BIDS system in accordance with one or more embodiments of the invention. Users 200 (e.g., building stakeholders such as designers or drafters) provide (e.g., create and/or retrieve) design data 202 and may interact through a BIDS user interface 204. Thus, design data 202 flows into the system from subscription customers 200 who have opted into the research program and are extensively utilizing design software of embodiments of the invention (e.g., the AUTODESK BUILDING DESIGN SUITE). Data 202 provided to the system is interpreted into the BIDS graph 206, and may be customized and modified to improve interpretations in the future.

Processed designs (e.g., design data 202 processed into the BIDS graph 206) are encoded in the knowledge repository 208 to enable processing by the BIDS system for later use. The BIDS user interface 204 is a set of research prototypes that enable interaction with the knowledge repository 208 to assist the design process. When the operator 200 has refined the design to their specifications, the BIDS system will enable export to a Building Information Model 210 or another representation that is defined by the user 200.

Logical Flow

Figure 3:
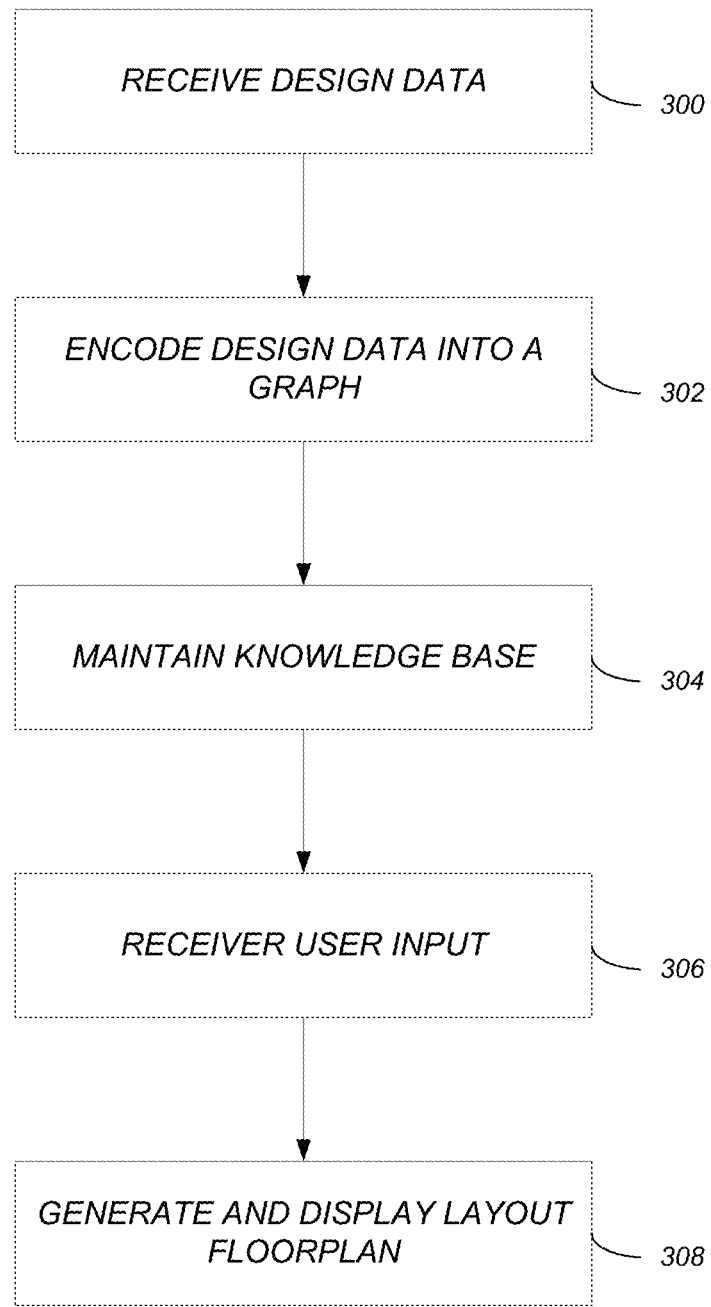
FIG. 3 illustrates the logical flow for dynamically generating a digital building information model in accordance with one or more embodiments of the invention.

FIG. 3 illustrates the logical flow for dynamically generating a digital building information model 210 in accordance with one or more embodiments of the invention.

At step 300, design data 202 for one or more architectural engineering and construction (AEC) designs is received.

At step 302, the design data 202 for each of the AEC designs is encoded into a graph 206. The encoding includes a recognition process that analyzes the design data 202 and produces a labeled representation of objects of the design data 202 and relationships between the objects.

At step 304, a knowledge base 208 is maintained. The knowledge base 208 is a collection of the design data 202, actions taken on the design data 202, and interpretations of the received design data 202. The knowledge base 208 processes and stores the graph 206. Further, the knowledge base 208 indexes and provides access to design knowledge. The knowledge base 208 is iteratively trained based on the graph 206 and updates to the graph 206. The knowledge base 208, based on the graph 206, translates user input for new design projects into actionable design models 210, documentation, and analytical data. In addition, the knowledge base 208 may translate the user input using a conditional generative adversarial network (GAN) that is iteratively trained and adapts to paired and unpaired datasets.

At step 306, user input is received. The user input consists of a user 200 drawing a sketch or a bubble diagram.

At step 308, as the user input is received, a layout floorplan (e.g., a building information model 210) is generated and displayed in real-time, in a layout viewport. The layout floorplan is generated and updated based on the user input and the knowledge base 208. Additional user input may also be accepted that enables the user to switch between the sketch, bubble diagram, or layout floorplan in real time. In addition, if the user input is a bubble diagram, it may be a raster bubble diagram, bounding boxes for each bubble may be detected, and a vector bubble diagram may be generated based thereon (wherein the vector bubble diagram may consist of functional and editable rectangles).

Further to the above, a parametric sketch generator may be utilized to create a dataset of wall sketches and template floor plans. The knowledge base may then be used to train the parametric sketch generator/dataset, and a revised sketch may be generated based thereon. In addition, within the knowledge base, a parametric bubble diagram generator may be created that is used to train a translator that translates from the bubble diagram to the layout floor plan. Lastly, to optimize the process of FIG. 3, constraints of a bubble diagram may be checked thereby leading to a revision of the bubble diagram and the generation and display of the layout floorplan (i.e., based on the revised bubble diagram).

Terminology

The terms and definitions set forth below provide the context within which embodiments of the invention may operate.

Design Data 202 is defined as data that has been submitted to BIDS including but not limited to sketches, diagrams, images, CAD documents, BIM documents, performance criteria, building schedules, construction assembly data, process model, project goals, financial data, specifications and/or product data.

BIDS Graph 206 is an encoding of the design data 202 that may be operated on directly by users 200 of the BIDS system. All data 202 received by the BIDS system is encoded inside of the graph 206. Based on how this data 202 is processed, it may be committed to the knowledge base 208 in various formats.

BIDS Knowledge Base 208 is a collection of design data 202, actions taken on design data 202 and interpretations of input from the design software that are recorded and structured for later retrieval. The knowledge base 208 specific to any customer is proprietary to the owner of the BIDS domain and/or profile. Operators may choose to share knowledge in exchange for access to aggregated data from outside their organization or industry or a tiered model of subscription.

BIDS User Interface 204 allows users to submit and modify content in the BIDS Knowledge Base 208. Embodiments of the invention may allow for sketches and bubble diagrams representing floor plan area, program/usage data and overall goals as initial input to begin generating design proposals.

Building Information Model 210 refers to a REVIT model (e.g., a parametric three-dimensional model that includes both geometry and non-geometric design and construction information) consisting of walls, windows, doors, floors and roof objects.

Operators/users 200 refer to human agents interacting with the BIDS research system.

Embodiments of the invention may be provided as a web environment with a browser-based interface. BIDS systems may also be hosted locally with scalable deployments via a third-party cloud provider.

Exemplary Workflow

The user experience of BIDS is different from industry standard design and documentation practices. Instead of defining solutions line by line or object by object as in CAD (computer-aided design) or BIM solutions, embodiments of the invention provide the ability for a design team to define a model of design intent that is translated into the design documentation. The model of design intent is used as input to generate new solutions that are revealed to the user. The user may then provide feedback to refine the model of design intent and produce more relevant design solutions.

Figure 4:
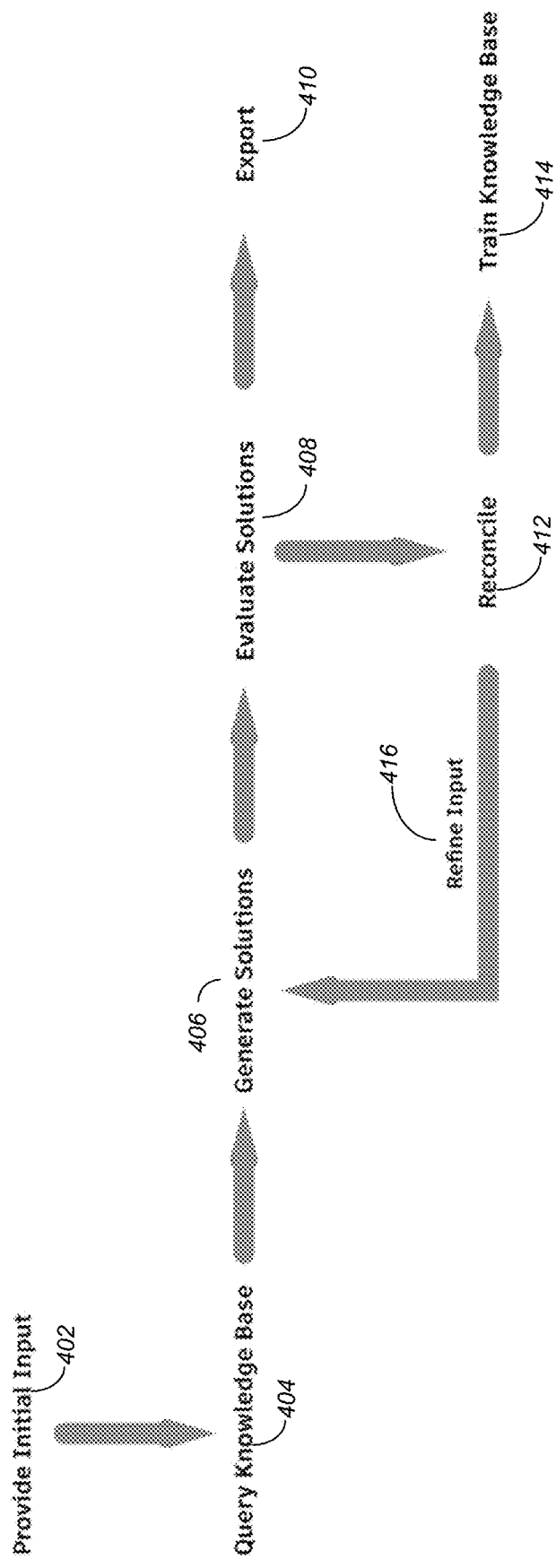
FIG. 4 illustrates the logical workflow for generating design solutions in accordance with one or more embodiments of the invention.

FIG. 4 illustrates the logical workflow for generating design solutions in accordance with one or more embodiments of the invention.

At step 402, the initial input/problem definition is provided. The user 200 begins an interaction with BIDS by defining high level goals and constraints for the project. Such input may include floor plans, diagrams, detail drawings, construction plans, material takeoffs, cost estimations, 3D models, and/or performance data. This input adds to the corpus of knowledge contained in the knowledge base 208 for a specific user 200 and their associated company profiles.

At step 404, the knowledge base 208 is queried.

At step 406, solutions are generated. The BIDS System attempts to provide output at various levels of detail and types of representation. In one or more embodiments, priority may be given to methods of generation that supply results in real time and support interactivity. The solutions generated may not be meant to be optimal solutions but can satisfy minimum requirements defined by the user in the problem definition phase. These satisfactory solutions and related performance data are used by building project stakeholders to support the design and construction process. The generation of solutions process includes evaluating solutions at 408 and outputting/exporting such solutions at 410. Alternatively, if an optimal solution is not identified, solutions may be reconciled at step 412 and used to train the knowledge base at 414 and/or to refine the input at 416 that is used to generate solutions at step 406. Solutions that are generated/evaluated/exported may include floor plans, diagrams, detail drawings, construction plans, material takeoffs, cost estimations, 3D models, and/or performance data.

Specific Exemplary Workflows

Based on the general workflow described above with respect to FIG. 4, various specific examples/scenarios may be useful to better understand the invention.

A first exemplary scenario is that of a residential layout—toy problem. In this exemplary scenario, a user provides a dataset of previously developed house designs as a coupled set (plan and semantic color field layout) of ~200 examples. The BIDS pipeline processes the input and trains a model with patterns derived from the input dataset. The user is then afforded the ability to generate plans and diagrammatic interpretations of sketches provided by the user. The dashboard of the Project BIDS interface provides information in real time about the performance (heuristic for spatial allocation and cost) of the generated design. The design may be modified and new results are produced in real-time.

A second exemplary scenario is that of an open office layout. In this scenario, a user provides a dataset of previously developed office layout designs as BIM models with BIDS processing filters applied. The user provides goals and constraints for the model generation. These goals include: set size to 5000 square foot, set building type, location and minimize energy use intensity. The user provides input in the form of sketches and/or direct control over the generative model. A dashboard reveals details that are inferred from the current state of design intent and analysis of the generated alternatives. The dashboard output calculates and reveals a variety of information including cost estimation, programmatic information (room types, spatial constraints (building footprint, easements, etc.)).

A third exemplary scenario is a company headquarters wing. The layout goals and requirements are set including the number of desks, size and shape of room, obstacles (structure, mechanical systems, primary circulation spaces, cost goals, user inputs, and sketch input as guides for layout). Embodiments of the invention explore states of the design input. The designer provides feedback on the interpretation and assigns preferences for generated outcomes/solutions. Future generated outcomes are influenced by the feedback provided by the designer.

As can be seen by the different scenarios, the level of utility and functionality in the BIDS System is dependent on the quantity, scale and quality and relevance of previous instances processed by the system. The system is designed to evolve and adapt based on user generated content and feedback. A baseline dataset may be assembled to support basic 'thin-slice' interactions in Project BIDS. In addition, performance of the generative model may be improved through dynamic multi-resolution training (e.g., a NEST-GAN training infrastructure).

Architecture Details

BIDS Graph 206

Figure 5A:
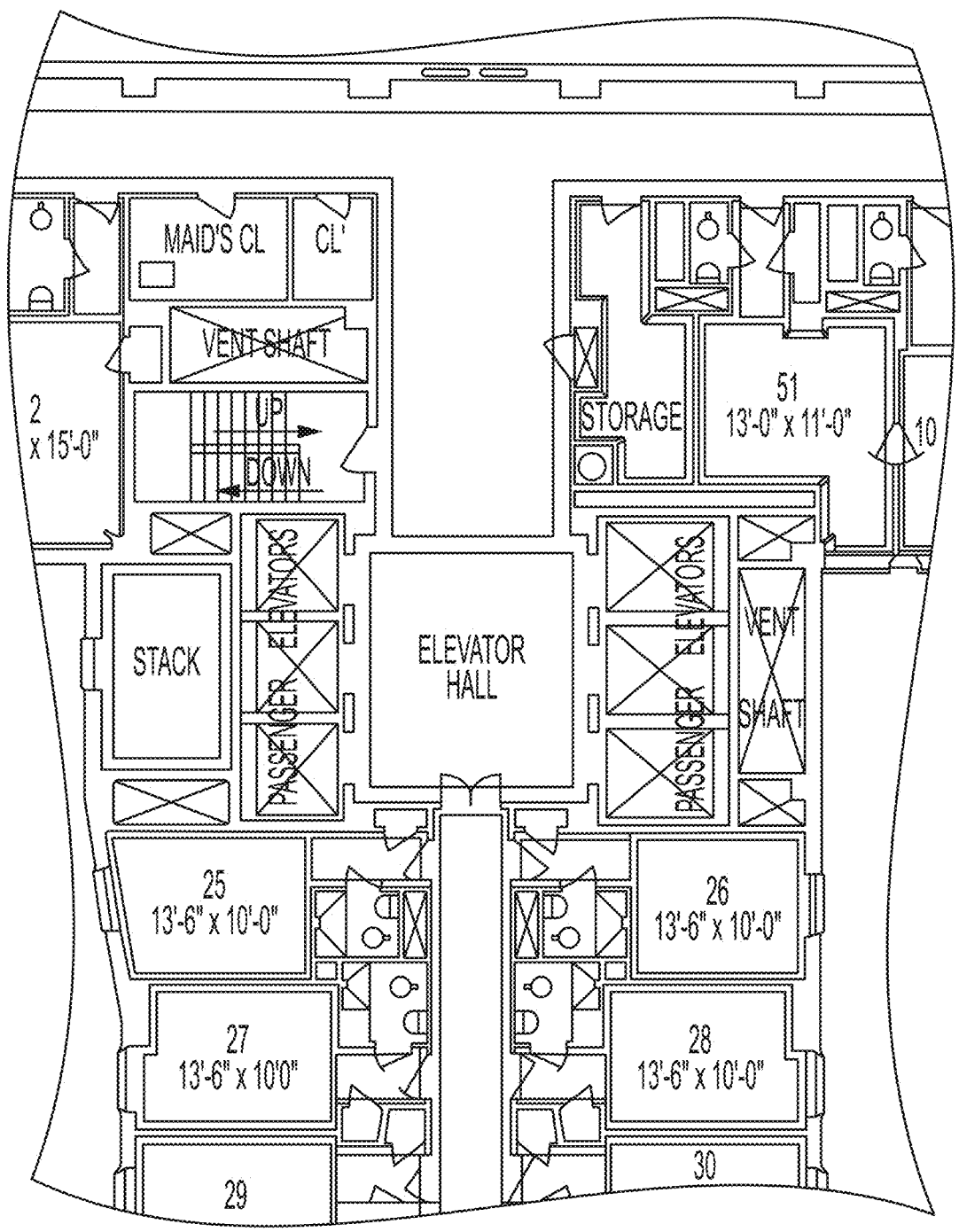
FIGS. 5A-5D illustrate the process of recognition and connectivity analysis supporting the development of the BIDS Graph in accordance with one or more embodiments of the invention.
Figure 5B:
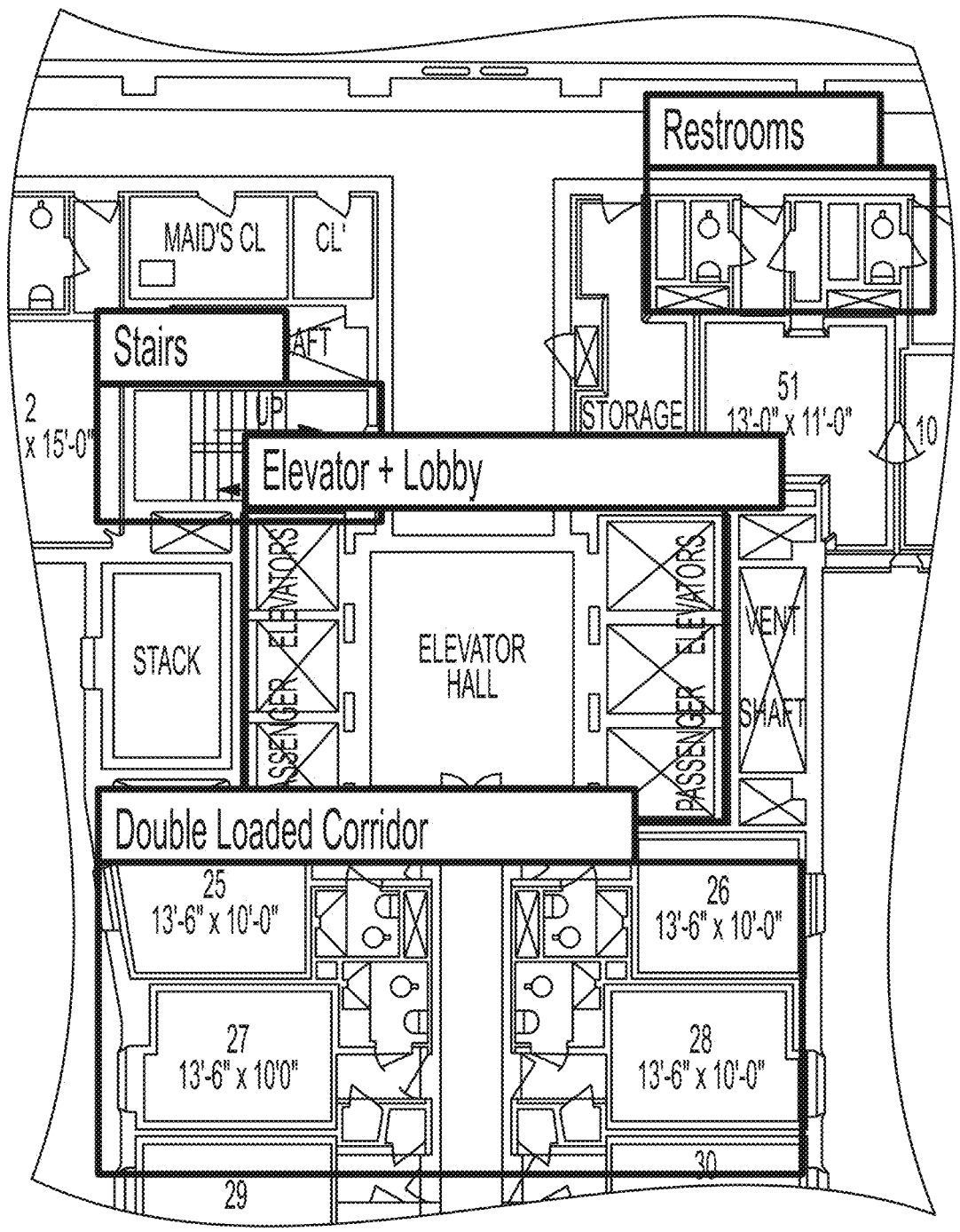
Figure 5C:
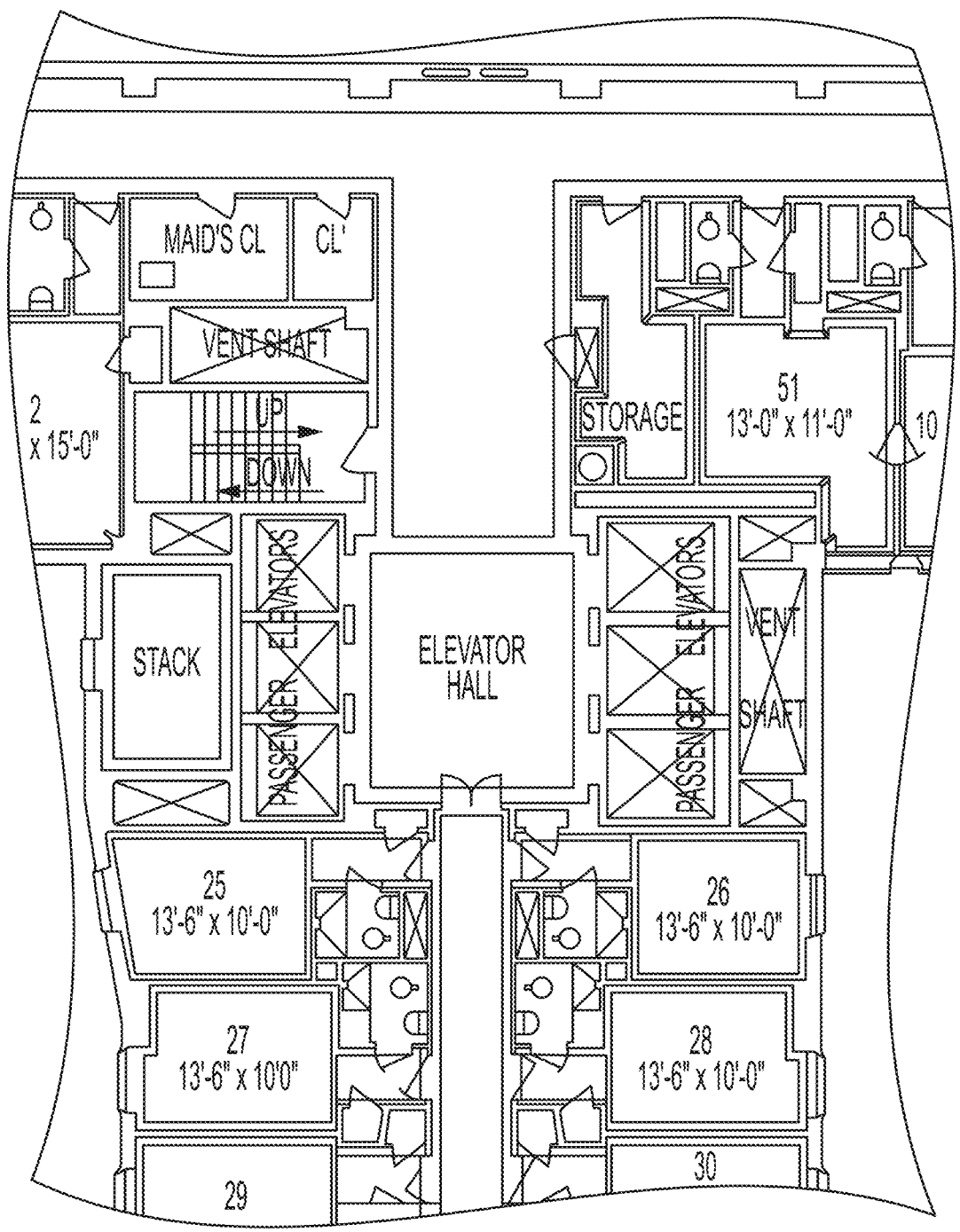
Figure 5D:
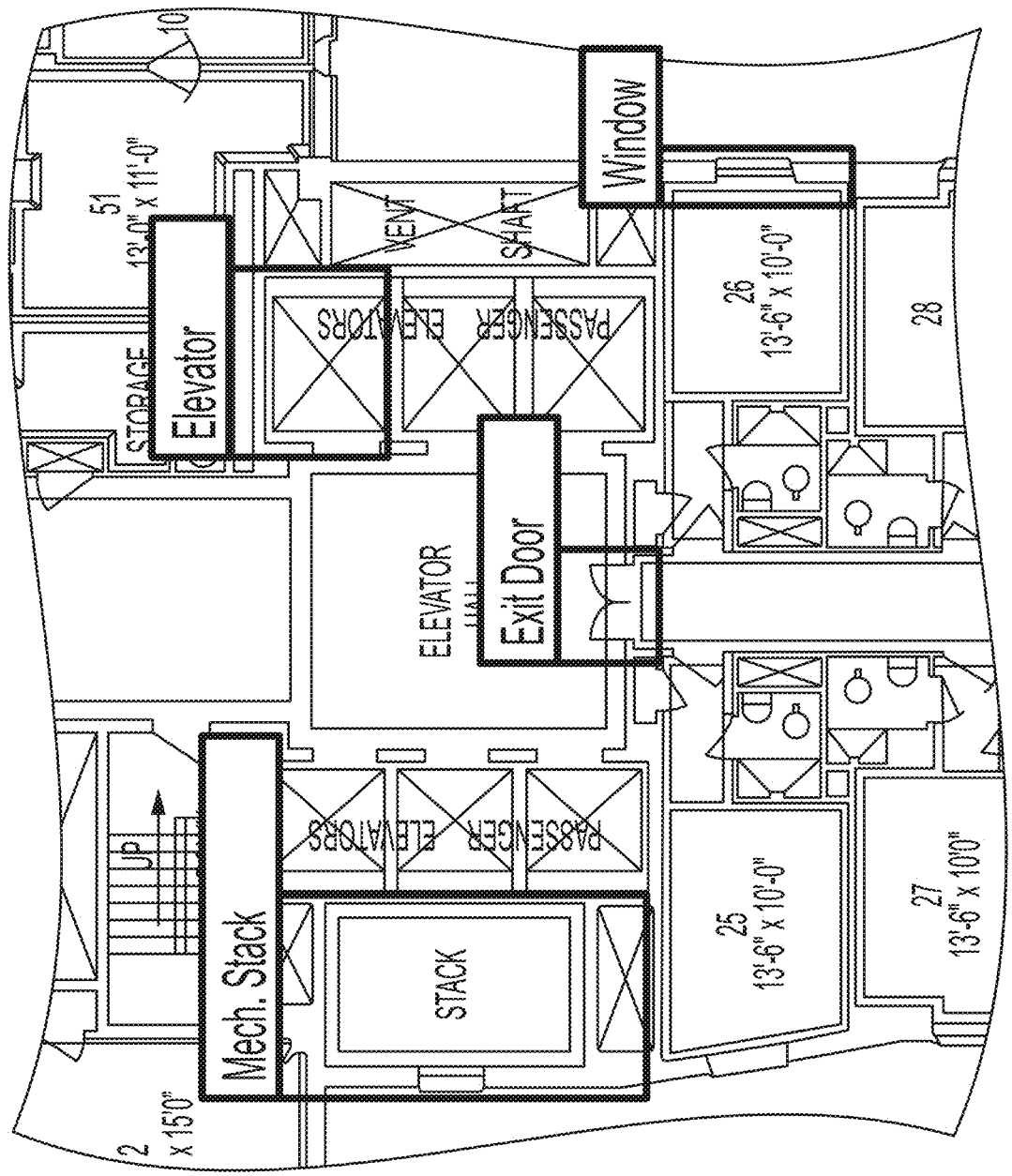

The first step of producing the BIDS graph 206 is a recognition process that analyzes the plans submitted to the system and produces a labeled representation of objects and relationships. FIGS. 5A-5D illustrate the process of recognition and connectivity analysis supporting the development of the BIDS Graph 206 in accordance with one or more embodiments of the invention. The definitions of elements may be explicitly defined and/or modified by the user. Patterns recognized from low level encodings may be aggregated as illustrated in FIGS. 5B and 5D. Specifically, 5A illustrates an original plan submitted to a system while FIG. 5B illustrates the high level encoding of that plan that produces a labeled representation of the plan including stairs, restrooms, elevator+lobby, and the double loaded corridor elements. Similarly, FIG. 5C illustrates the same plan while FIG. 5D illustrates the low level encoding conducted during the recognition process in which the additional elements of the mech. stack, elevator, exit door, and window elements have been identified and labeled accordingly.

Based on these recognition processes, a graph 206 is formed that encodes the objects identified in the plans submitted to the system. Multiple encodings or views of the BIDS graph 206 may be supported including a construction/assembly view, a layout view, and multiple performance views. Multiple encodings of the BIDS graph 206 for any design instance may be stored in the BIDS knowledge base 208 for processing and reasoning.

Figure 6:
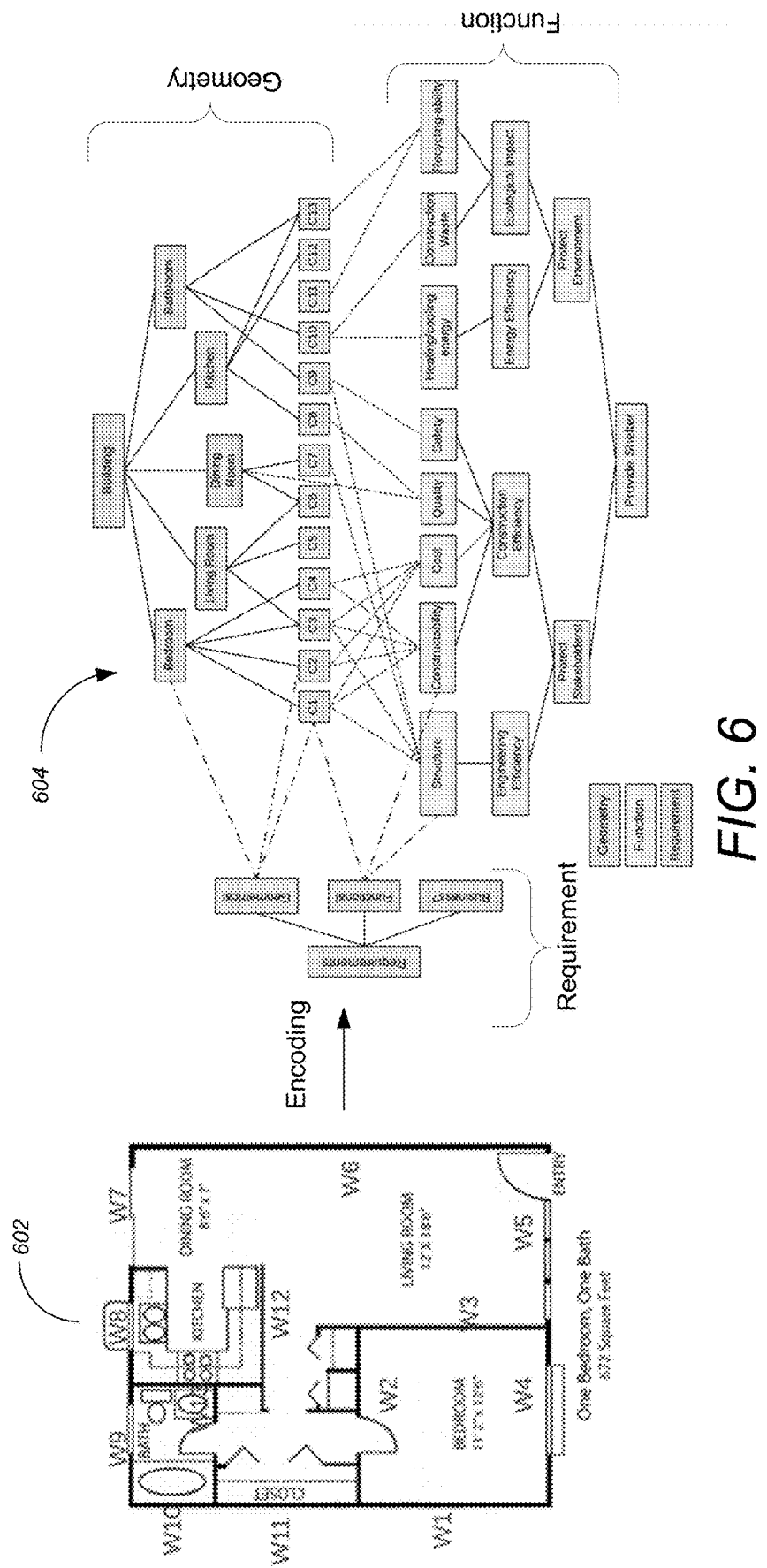
FIG. 6 illustrates a BIDS graph example representation with functional, geometric, and requirement views in accordance with one or more embodiments of the invention.

FIG. 6 illustrates a BIDS graph example representation with functional, geometric, and requirement views in accordance with one or more embodiments of the invention. In particular, area 602 illustrates a floor plan with labels and the resulting graph is illustrated in area 604.

Knowledge Base 208

An interface is provided to view and modify knowledge that has been previously inferred or authored in the knowledge base 208. A baseline knowledge base 208 is provided to users 200 at initial usage and may be modified actively or passively by setting up explicit rules or submitting training cases. The ontology that serves the knowledge base 208 is an elemental classification that is augmented by a recognition system built up from BIDS graph definitions.

As data is aggregated, the knowledge base 208 serves several functions:

Index design knowledge and allow for rapid access and read/write activities;

An interactive model of the classification system (ontology manager);

An executable representation of knowledge from which to calculate cost functions for generation;

The foundation for a geometric knowledge authoring tool for pattern encoding; and A functional 'wiki' for design patterns that may be distributed to other users.

Design stakeholders may author design knowledge into the knowledge base 208 for use in the BIDS system.

To better understand the knowledge base, a description of some exemplary authoring workflows/scenarios may be useful.

A first example may be used to illustrate an active authoring workflow. An architectural firm (Firm A) has designed a parametric model script that effectively supports the conceptual planning/massing for 3-6 floor urban office buildings located in San Francisco, CA. Firm A chooses to publish the strategy as a Mid Office Strategy to the BIDS system. Another design/architectural firm (Firm B) may use BIDS in the future to evaluate the Mid Office Strategy automatically when the requirements are specified by the user (in this case, in San Francisco (or functionally similar environment), 3-6 floors are appropriate and the program is an office building). Following a search metaphor, the best designs that support engagement and further use are prioritized. Through repetitive use, the Mid Office Strategy may become a popular strategy and serve as the basis for further elaborations and several built projects. A marketplace for strategies may be supported in this way as the infrastructure grows to support a search-like design experience. Firm A may be entitled to receive compensation for their authoring of reusable patterns into the BIDS system.

A second example may be used to illustrate a passive authoring workflow. In this example, a design firm (Firm C) has submitted hundreds of examples for cubicle layout into the BIDS system. This corpus has been processed and encoded in a way that supports effective re-use. An architecture firm (Firm D) has a new project that requires open office space and has specified these requirements into the BIDS system. The BIDS system then generates novel cubicle layouts that have been trained by Firm C's previous design work. Further, a builder (Builder A) may have constructed several interior open office projects that are similar to the cubicle layouts that have been generated and their construction process data (cost, risk, timeline, safety, etc.) helps the BIDS system to calculate a cost and timeline estimate for the Firm C team.

BIDS Translators

The BIDS system (e.g., within the knowledge base 208) contains a set of orchestrated training and inference tools that are responsible for translating design intent into a functional design representation. The production of a 'bottom-up' parametric generation system with outputs that include detailed floor plans, project schedules, synthetic point clouds, 3D models, elevations, sections, cost estimates, etc. have the benefit of training a model to perform high-quality translations to and from any supported output.

Figure 7:
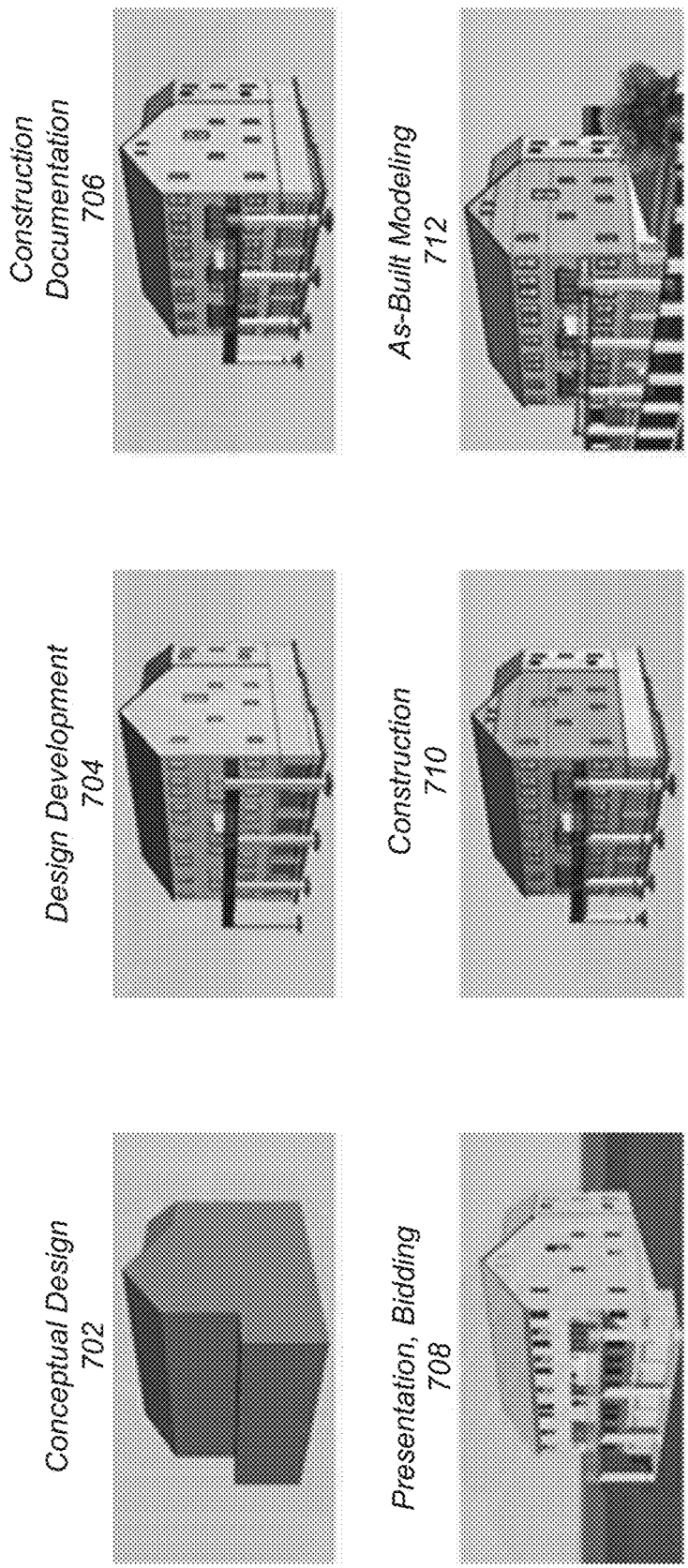
FIG. 7 illustrates six levels of resolution for a BIM project in accordance with one or more embodiments of the invention.

As translators become more sophisticated, one outcome will be the ability to generate varying interpretations of the design intent at varying levels of detail. FIG. 7 illustrates six levels of resolution 702-712 for a BIM project in accordance with one or more embodiments of the invention. The different levels of resolution range from conceptual design 702, to design development 704, to construction documentation 706, to presentation/bidding 708, to construction 710, to an as-built model 712. BIDS translators have the potential to generate high resolution instances of a conceptual model 702 (e.g., the as-built model 712), saving days or weeks of work when compared to design practice today.

Content and Model Distribution System

Figure 8:
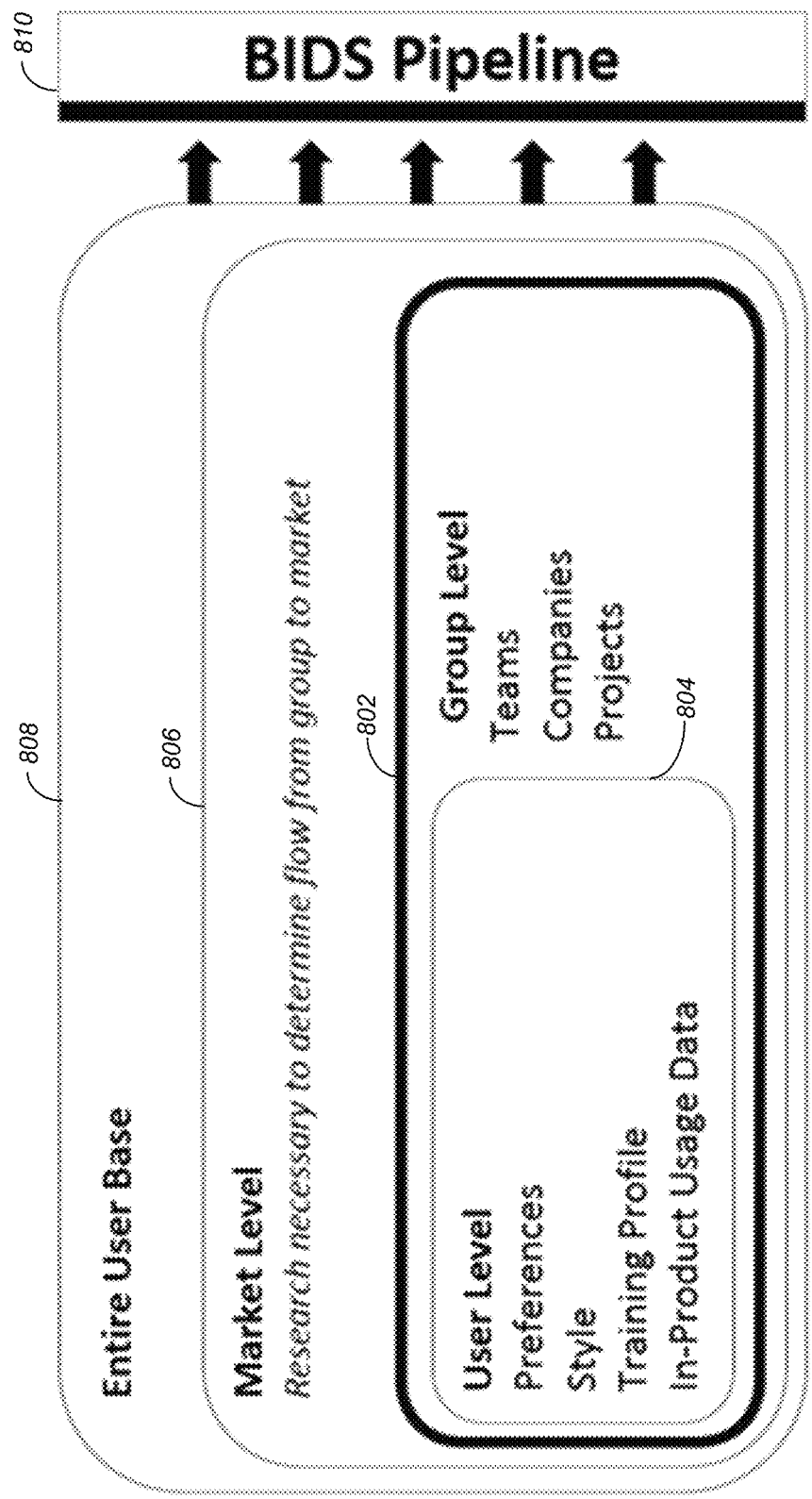
FIG. 8 illustrates such an infrastructure in accordance with one or more embodiments of the invention.

Embodiments of the invention may enable the ability for content creators (e.g., design/architectural firms, users, building stakeholders, etc.) to distribute and/or make/sell their content to the public/individuals. In this regard, the BIDS system may enable a new method for delivering designs and provide for the purchase of software/designs. To support such capabilities, embodiments of the invention provide an intellectual property based infrastructure. FIG. 8 illustrates such an infrastructure in accordance with one or more embodiments of the invention.

In FIG. 8, the 'Group Level' knowledge 802 that is exposed to the system represents a data firewall. Such group level data may include data created by teams, companies and projects. Within the group level 802 is the user level 804 that includes preferences, style, training profiles, and in-product data usage. How and when data moves through this firewall 802 and becomes monetized by becoming publicly available will determine social, legal and economically viable directions forward with the training and inference architecture. The market level 806 provides the research necessary to determine the flow from the group 802 to the market. Lastly, the entire user base 808 may be monetized. Each of the different levels 802-808 may be published/provided/shared externally via the BIDS pipeline 810.

Exemplary Implementation

The description above provides a general description of the architecture and workflows for a BIDS system. However, to better understand the invention, a description of a specific implementation may be useful.

Figure 9:
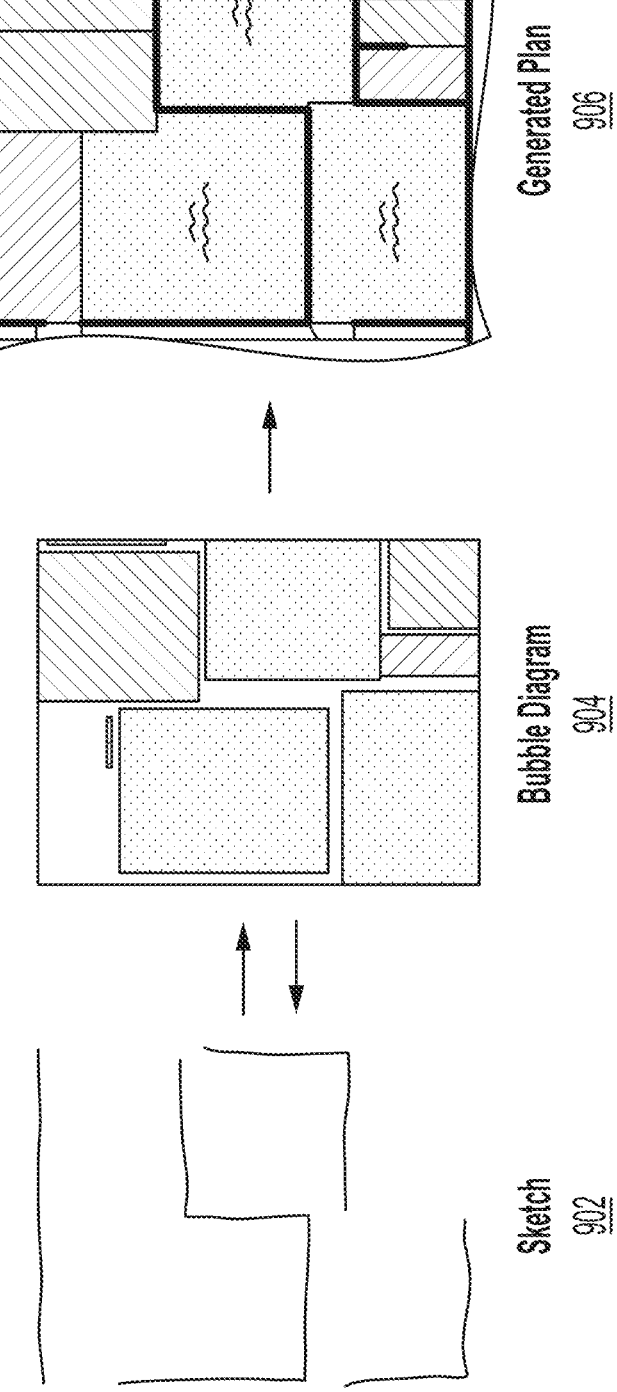
FIG. 9 illustrates results from a real-time interactive generative design and optimization process in accordance with one or more embodiments of the invention.

FIG. 9 illustrates results from a real-time interactive generative design and optimization process in accordance with one or more embodiments of the invention. In particular, the user interface output via steps 306-308 of FIG. 3 is illustrated in FIG. 9. The user input includes a user drawing a sketch 902 and/or a bubble diagram 904. As the user input is received, in a separate layout viewport, a layout generated floorplan 906 is generated, updated, and displayed in real-time. Such a generated floor plan 906 is generated and displayed based on the user input (i.e., sketch 902/bubble diagram 904) and the knowledge base that has been created and maintained. For example, as the user is drawing a sketch 902 that includes a line representing a wall, embodiments of the invention may automatically generate a bubble diagram 904 and a floorplan 906 that may include completed walls and details such as furniture. In other words, as a user draws a sketch 902, there is a real-time auto-completion of a bubble diagram 904/floorplan 906 (e.g., in a separate window). The knowledge base enables such an auto-completion based on a recognition that thin user drawn lines may represent an interior space and double-lines may represent windows.

Figure 10:
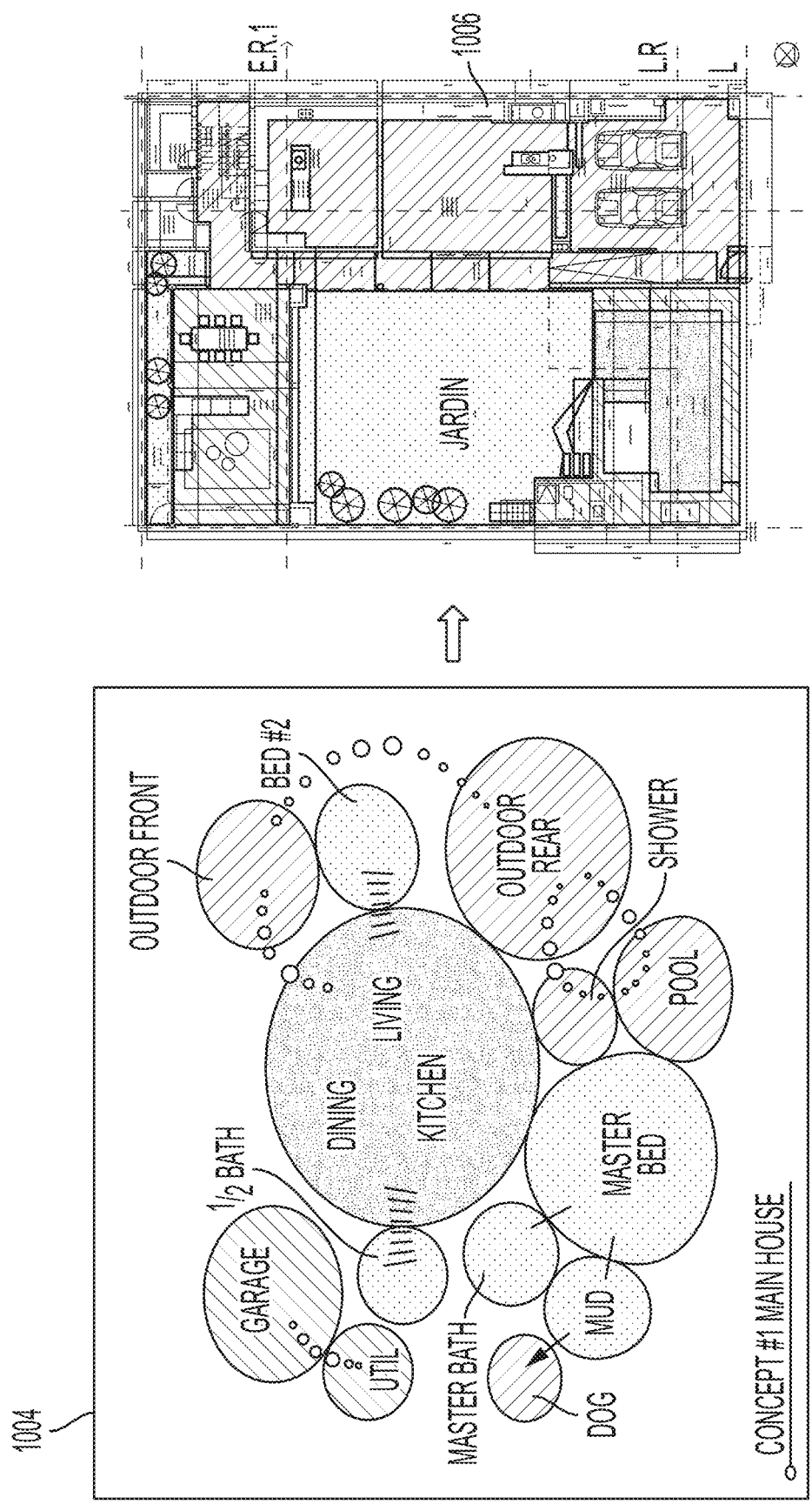
FIG. 10 illustrates an implementation example of a real-time generation of a completed plan/layout from a bubble diagram in accordance with one or more embodiments of the invention.

Similar to generating a bubble diagram 904 from a sketch 902, the generated plan 906 may be auto generated from a bubble diagram 904. FIG. 10 illustrates an implementation example of a real-time generation of a completed plan/layout 1006 from a bubble diagram 1004 in accordance with one or more embodiments of the invention. The left side 1004 illustrates a bubble diagram showing links between different bubbles representing different rooms (e.g., garage, dining, kitchen, living, bedroom, etc.). The right side 1006 illustrates the generated layout 1006 from the bubble diagram 1004. Further, as the user edits the bubble diagram 904/1004, the layout/plan 906/1006 will change/update in real-time to reflect such changes (e.g., both with respect to the geometry as well as the connections). Further, the generation of the bubble diagrams 904/1004 and/or layouts/plans 906/1006 may be optimized (e.g., based on construction cost, adjacency on a walking path, etc.), wherein the parameters of such optimization may be predefined, established via the knowledge base, and/or defined/selected by the user.

In view of the above, embodiments of the invention provide the ability to interpret design data into a graph that is maintained within a knowledge base and can be customized and modified to improve interpretations of user input. A BIDS user interface enable interaction with the knowledge base and displays an interpreted floorplan/layout based on the user input in real-time. As described above, such a generated floor plan may be based on multiple ways of input using a generative adversarial network (GAN). Further, image-to-image translation (e.g., a conditional GAN) may be used to translate sketches 902 and bubble diagrams 904/1004 into completed floor plans 906/1006.

Figure 11:
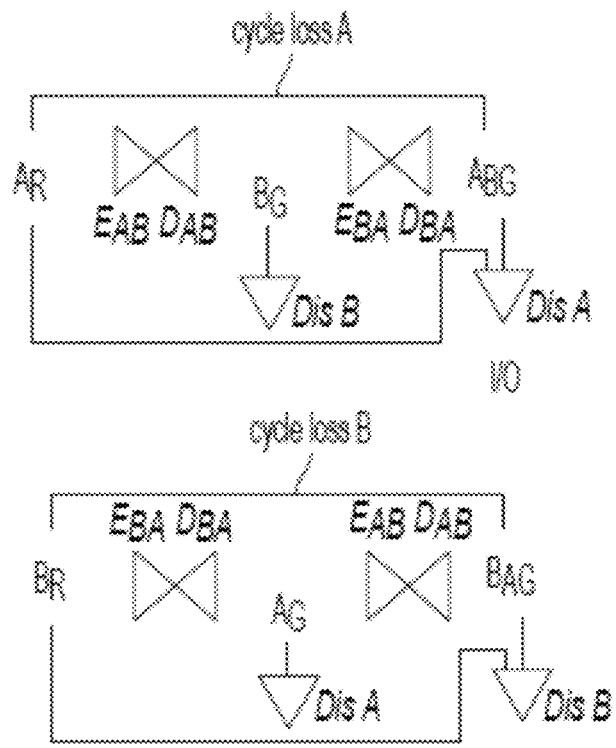
FIG. 11 illustrates a prior art GAN that only accepts unpaired data.

Within GAN, to generate such plans 906/1006, embodiments of the invention may utilize the deep Residual network (aka RESNET), which contains nine (9) residual blocks (convolution-batch normalization-ReLU). The training process for the knowledge base and RESNET is an improved version of a Cycle-GAN because it can adapt to paired and unpaired datasets. FIG. 11 illustrates a prior art Cycle-GAN that only accepts unpaired data. As shown, E is an encoder, D is a decoder, Dis is a discriminator, $A_R$ and $B_R$ are real images of A and B, $A_G$ is image A generated by $E_{BA}D_{BA}$, $B_G$ is image B generated by $E_{AB}D_{AB}$, $A_{BG}$ is image A generated by $E_{AB}D_{AB}+E_{BA}D_{BA}$, and BAG is image B generated by $E_{BA}D_{BA}+E_{AB}D_{AB}$.

Figure 12:
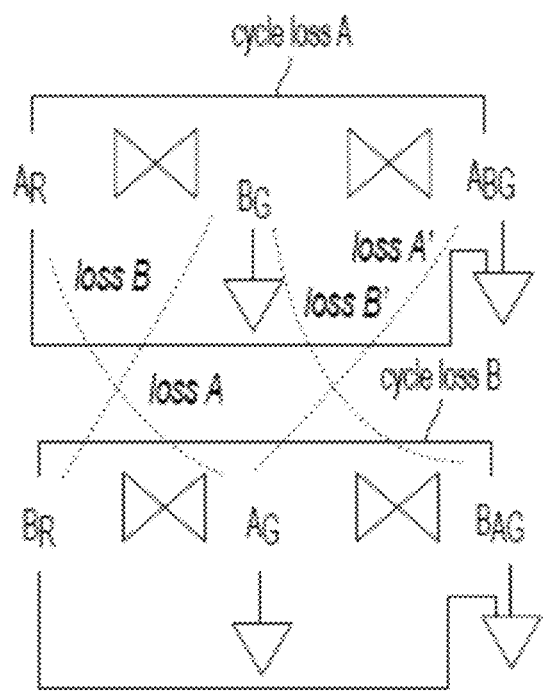
FIG. 12, illustrates a GAN that works for both paired and unpaired data in accordance with one or more embodiments of the invention.

In contrast to FIG. 11, FIG. 12, illustrates a GAN that works for both paired and unpaired data in accordance with one or more embodiments of the invention. In FIG. 12, the extra loss (A, B, A', and B') can provide further constraints for the model to train on paired data and create flexibility to accept both paired and unpaired data.

Further to the above, embodiments of the invention provide an interactive system that runs multiple GANs and recognition models at the same time to achieve a real-time user-in-the-loop interactive generative design and optimization process. In this regard, the user can use sketches or bubble diagrams as input, and the system can generate correspondent floor plans and functional statistics in real-time. The trained models may be initialized at the same time, and will be triggered once a correspondent result is generated. For example, a floor plan is generated when a sketch is updated, and the generated floor plan is sent to another model as input to generate a bubble diagram.

Figure 13:
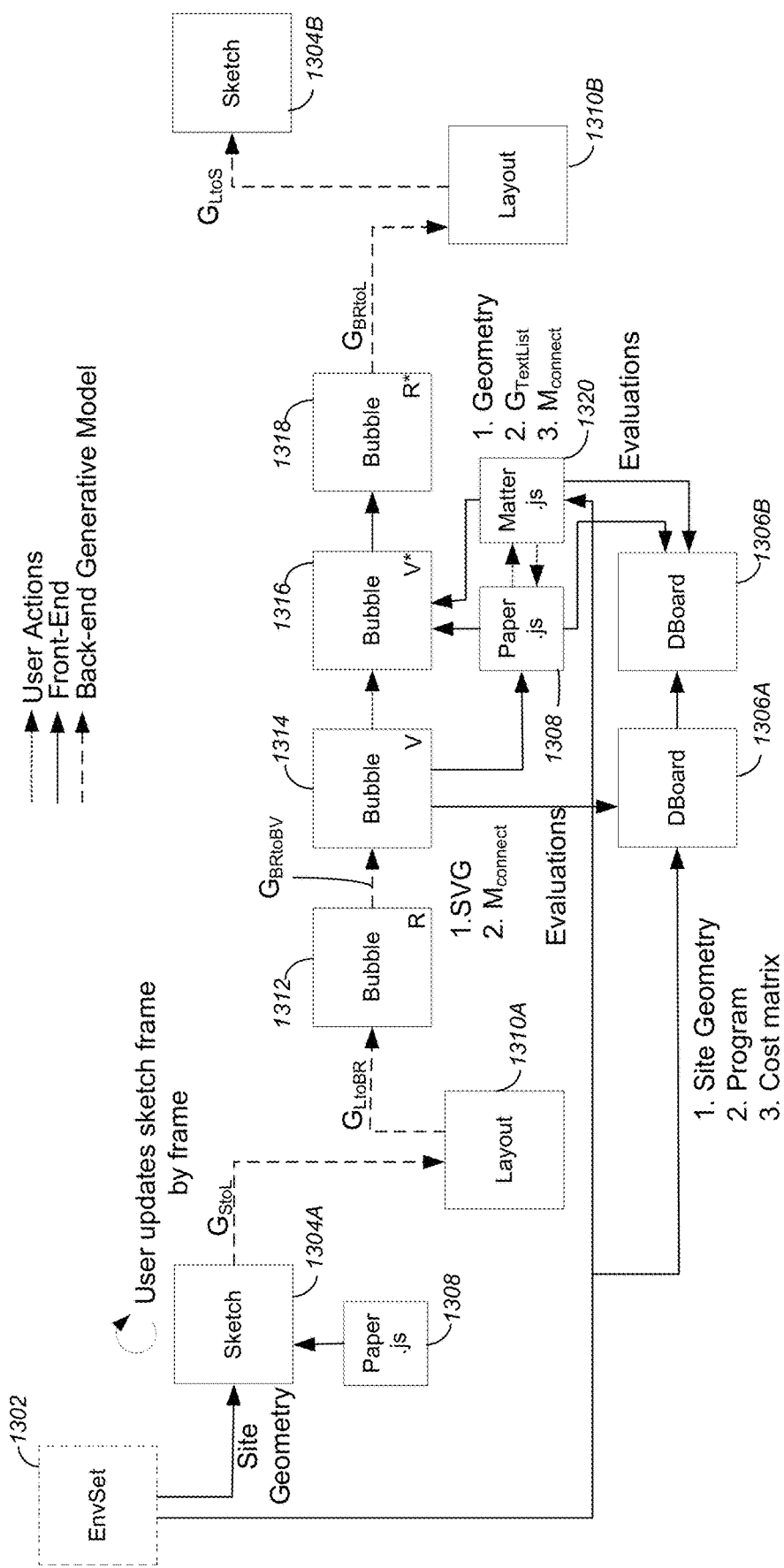
FIG. 13 illustrates a system architecture for such a BIDS workflow in accordance with one or more embodiments of the invention.

FIG. 13 illustrates a system architecture for such a BIDS workflow in accordance with one or more embodiments of the invention. In the front-end, from environmental settings 1302, site geometry may be provided/input to a sketch 1304A. Alternatively, or in addition, site geometry, a program, and a cost matrix may be provided from the environmental settings 1302 into a dashboard 1306. Site geometry, a program, and/or cost matrix may be obtained from environmental settings 1302 into a sketch 1304A or a dashboard 1306A. A user may update the sketch frame by frame (e.g., in a drawing/drawing application using a JavaScript paper application 1308).

In the back-end generative model, the sketch (S) 1304 may be transformed/used to generate a layout (L) 1310 (e.g., a graph). The generative model may then provide for generating/creating a raster bubble diagram 1312. The generative model may further provide for the real-time generation of the vector bubble diagram 1314. The vector bubble diagram may be displayed in dashboard 1306A (e.g., by providing scalable vector graphics [SVG] data as well as app data [e.g., Mconnect]) via various evaluations, such as the current total floor area and number of rooms. The user may edit the vector bubble diagram 1314 thereby transitioning to a new vector bubble diagram (V*) 1316. For example, the paper JavaScript application 1308 or matter JavaScript application 1320 may be used to generate the new vector bubble diagram 1316. Such a generation may include a user providing geometry, a geometry text list, and or Mconnect information (which may also be performed in the dashboard 1306B). Based on the new vector bubble diagram 1316, a new raster bubble diagram (R*) 1318 may also be generated. From the new raster bubble diagram 1318, an updated layout 1310B may be generated, which can in turn be used to generate a new/updated sketch 1304B. Accordingly, based on the above, the process from sketch to bubble diagram to layout is bi-directional while relying on various intermediate diagrams (e.g., vector and/or raster bubble diagrams 1312-1318).

Based on the architecture of FIG. 13, users are able to switch between free-hand sketches 1304 and/or high level conceptual inputs such as a bubble diagram 1312-1318, to generate a new layout 1310. Thus, embodiments of the invention combine GAN models and object recognition techniques to make a "looping" process where the user can switch between different representations in real-time (e.g., sketch and bubble diagrams).

Further, as described in FIG. 13, there is a two-step process to vectorize the images generated by GAN to bubble diagrams 1312-1318 using object recognition. Specifically, the floor plan/layout 1310 generated by image-to-image translation GANS may still be images that cannot be used by the user. For example, although bubble diagrams 1312 may be generated based on user sketches 1304, the generated bubble diagrams 1312 may not be editable because they are images. Accordingly, embodiments of the invention provide an object recognition system on top of the generated bubble diagrams 1312 so that functional and editable rectangles (e.g., editable bubble diagrams 1314-1316) can be generated for the user to modify. Specific implementations may utilize a network structure consisting of a 101 res-net and fast-rcnn, where the input is a raster bubble diagram 1312 and the output is a set of labeled rectangles 1314. In addition, the nature of object recognition models may be directly utilized by detecting bounding boxes for objects in an image (as a method of vectorization). As the rooms in a floor plan 1310 are rectangles, vectorized representations (e.g., bubble diagram 1314-1316) of the rooms may be acquired by detecting the bounding boxes.

Further to the above, the training process may be enhanced using parametric sketch and bubble diagram generators. In this regard, one of the issues of training image-to-image GAN is that there is no paired data, or just a lack of data. For example, there may be no clean sketches of architecture walls available. As a result, a parametric sketch generator may be utilized to generate/create a dataset of wall sketches and floor plans (un-paired) and a GAN may be used to train the sketch generators. Further, a parametric bubble diagram generator may be used to train the bubble to floor plan translator, as well as the object recognition model for bubble diagram vectorization.

In addition, an optimization process may be utilized to enhance the reliability and performance of any GAN generated results. In this regard, generated floor plans/layouts 1310 may not be guaranteed to be optimized because the mapping is based on user input (e.g., sketch or bubble diagram) to the output. If the sketch or bubble diagram is not good enough, the generated floor plan will not be perfect. Therefore, a post-process optimization process may be utilized that checks constraints such as connectivity of the rooms, for the user to further optimize their bubble diagrams and generate more reasonable floor plans. Embodiments of the invention may utilize an optimization engine that is based on a physics engine (e.g., matter.js).

Hardware Environment

Figure 14:
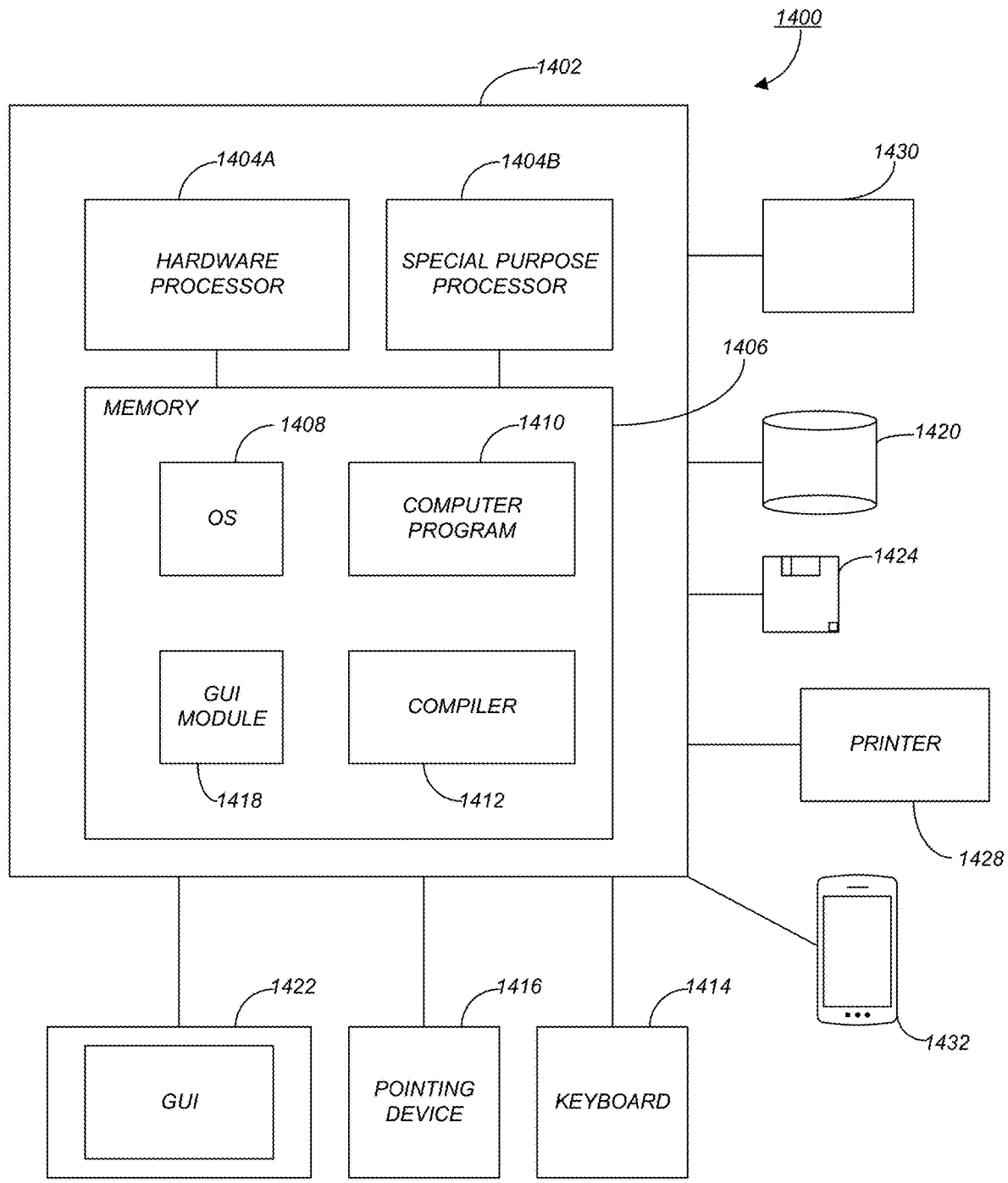
FIG. 14 is an exemplary hardware and software environment used to implement one or more embodiments of the invention.

FIG. 14 is an exemplary hardware and software environment 1400 used to implement one or more embodiments of the invention. The hardware and software environment includes a computer 1402 and may include peripherals. Computer 1402 may be a user/client computer, server computer, or may be a database computer. The computer 1402 comprises a hardware processor 1404A and/or a special purpose hardware processor 1404B (hereinafter alternatively collectively referred to as processor 1404) and a memory 1406, such as random access memory (RAM). The computer 1402 may be coupled to, and/or integrated with, other devices, including input/output (I/O) devices such as a keyboard 1414, a cursor control device 1416 (e.g., a mouse, a pointing device, pen and tablet, touch screen, multi-touch device, etc.) and a printer 1428. In one or more embodiments, computer 1402 may be coupled to, or may comprise, a portable or media viewing/listening device 1432 (e.g., an MP3 player, IPOD, NOOK, portable digital video player, cellular device, personal digital assistant, etc.). In yet another embodiment, the computer 1402 may comprise a multi-touch device, mobile phone, gaming system, internet enabled television, television set top box, or other internet enabled device executing on various platforms and operating systems.

In one embodiment, the computer 1402 operates by the hardware processor 1404A performing instructions defined by the computer program 1410 under control of an operating system 1408. The computer program 1410 and/or the operating system 1408 may be stored in the memory 1406 and may interface with the user and/or other devices to accept input and commands and, based on such input and commands and the instructions defined by the computer program 1410 and operating system 1408, to provide output and results.

Output/results may be presented on the display 1422 or provided to another device for presentation or further processing or action. In one embodiment, the display 1422 comprises a liquid crystal display (LCD) having a plurality of separately addressable liquid crystals. Alternatively, the display 1422 may comprise a light emitting diode (LED) display having clusters of red, green and blue diodes driven together to form full-color pixels. Each liquid crystal or pixel of the display 1422 changes to an opaque or translucent state to form a part of the image on the display in response to the data or information generated by the processor 1404 from the application of the instructions of the computer program 1410 and/or operating system 1408 to the input and commands. The image may be provided through a graphical user interface (GUI) module 1418. Although the GUI module 1418 is depicted as a separate module, the instructions performing the GUI functions can be resident or distributed in the operating system 1408, the computer program 1410, or implemented with special purpose memory and processors.

In one or more embodiments, the display 1422 is integrated with/into the computer 1402 and comprises a multi-touch device having a touch sensing surface (e.g., track pod or touch screen) with the ability to recognize the presence of two or more points of contact with the surface. Examples of multi-touch devices include mobile devices (e.g., IPHONE, NEXUS S, DROID devices, etc.), tablet computers (e.g., IPAD, HP TOUCHPAD), portable/handheld game/music/video player/console devices (e.g., IPOD TOUCH, MP3 players, NINTENDO 3DS, PLAYSTATION PORTABLE, etc.), touch tables, and walls (e.g., where an image is projected through acrylic and/or glass, and the image is then backlit with LEDs).

Some or all of the operations performed by the computer 1402 according to the computer program 1410 instructions may be implemented in a special purpose processor 1404B. In this embodiment, some or all of the computer program 1410 instructions may be implemented via firmware instructions stored in a read only memory (ROM), a programmable read only memory (PROM) or flash memory within the special purpose processor 1404B or in memory 1406. The special purpose processor 1404B may also be hardwired through circuit design to perform some or all of the operations to implement the present invention. Further, the special purpose processor 1404B may be a hybrid processor, which includes dedicated circuitry for performing a subset of functions, and other circuits for performing more general functions such as responding to computer program 1410 instructions. In one embodiment, the special purpose processor 1404B is an application specific integrated circuit (ASIC).

The computer 1402 may also implement a compiler 1412 that allows an application or computer program 1410 written in a programming language such as C, C++, Assembly, SQL, PYTHON, PROLOG, MATLAB, RUBY, RAILS, HASKELL, or other language to be translated into processor 1404 readable code. Alternatively, the compiler 1412 may be an interpreter that executes instructions/source code directly, translates source code into an intermediate representation that is executed, or that executes stored precompiled code. Such source code may be written in a variety of programming languages such as JAVA, JAVASCRIPT, PERL, BASIC, etc. After completion, the application or computer program 1410 accesses and manipulates data accepted from I/O devices and stored in the memory 1406 of the computer 1402 using the relationships and logic that were generated using the compiler 1412.

The computer 1402 also optionally comprises an external communication device such as a modem, satellite link, Ethernet card, or other device for accepting input from, and providing output to, other computers 1402.

In one embodiment, instructions implementing the operating system 1408, the computer program 1410, and the compiler 1412 are tangibly embodied in a non-transitory computer-readable medium, e.g., data storage device 1420, which could include one or more fixed or removable data storage devices, such as a zip drive, floppy disc drive 1424, hard drive, CD-ROM drive, tape drive, etc. Further, the operating system 1408 and the computer program 1410 are comprised of computer program 1410 instructions which, when accessed, read and executed by the computer 1402, cause the computer 1402 to perform the steps necessary to implement and/or use the present invention or to load the program of instructions into a memory 1406, thus creating a special purpose data structure causing the computer 1402 to operate as a specially programmed computer executing the method steps described herein. Computer program 1410 and/or operating instructions may also be tangibly embodied in memory 1406 and/or data communications devices 1430, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 1402.

Figure 15:
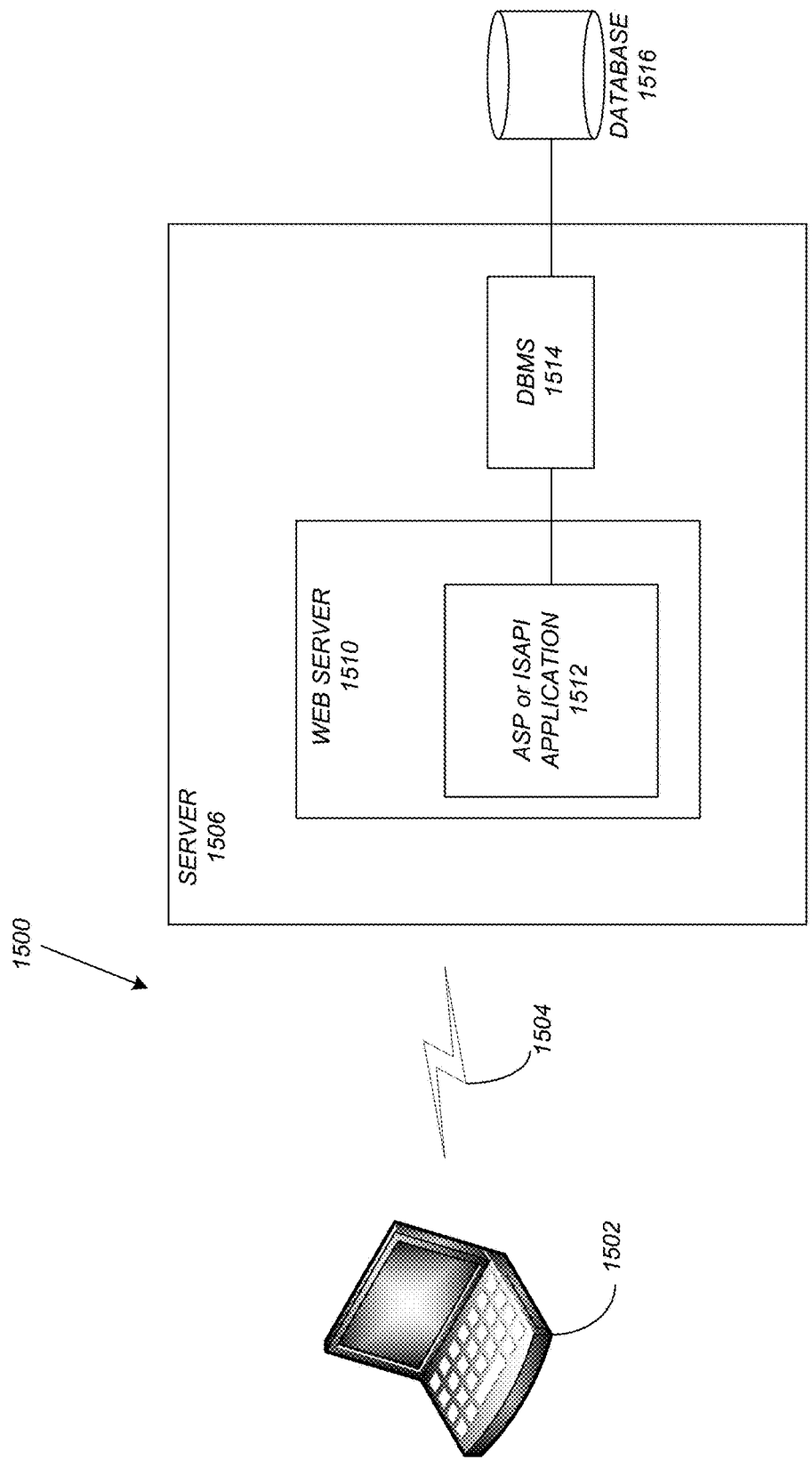
FIG. 15 schematically illustrates a typical distributed/cloud-based computer system using a network to connect client computers to server computers.

FIG. 15 schematically illustrates a typical distributed/cloud-based computer system 1500 using a network 1504 to connect client computers 1502 to server computers 1506. A typical combination of resources may include a network 1504 comprising the Internet, LANs (local area networks), WANs (wide area networks), SNA (systems network architecture) networks, or the like, clients 1502 that are personal computers or workstations (as set forth in FIG. 14), and servers 1506 that are personal computers, workstations, minicomputers, or mainframes (as set forth in FIG. 14). However, it may be noted that different networks such as a cellular network (e.g., GSM [global system for mobile communications] or otherwise), a satellite based network, or any other type of network may be used to connect clients 1502 and servers 1506 in accordance with embodiments of the invention.

A network 1504 such as the Internet connects clients 1502 to server computers 1506. Network 1504 may utilize ethernet, coaxial cable, wireless communications, radio frequency (RF), etc. to connect and provide the communication between clients 1502 and servers 1506. Further, in a cloud-based computing system, resources (e.g., storage, processors, applications, memory, infrastructure, etc.) in clients 1502 and server computers 1506 may be shared by clients 1502, server computers 1506, and users across one or more networks. Resources may be shared by multiple users and can be dynamically reallocated per demand. In this regard, cloud computing may be referred to as a model for enabling access to a shared pool of configurable computing resources.

Clients 1502 may execute a client application or web browser and communicate with server computers 1506 executing web servers 1510. Such a web browser is typically a program such as MICROSOFT INTERNET EXPLORER, MOZILLA FIREFOX, OPERA, APPLE SAFARI, GOOGLE CHROME, etc. Further, the software executing on clients 1502 may be downloaded from server computer 1506 to client computers 1502 and installed as a plug-in or ACTIVEX control of a web browser. Accordingly, clients 1502 may utilize ACTIVEX components/component object model (COM) or distributed COM (DCOM) components to provide a user interface on a display of client 1502. The web server 1510 is typically a program such as MICROSOFT'S INTERNET INFORMATION SERVER.

Web server 1510 may host an Active Server Page (ASP) or Internet Server Application Programming Interface (ISAPI) application 1512, which may be executing scripts. The scripts invoke objects that execute business logic (referred to as business objects). The business objects then manipulate data in database 1516 through a database management system (DBMS) 1514. Alternatively, database 1516 may be part of, or connected directly to, client 1502 instead of communicating/obtaining the information from database 1516 across network 1504. When a developer encapsulates the business functionality into objects, the system may be referred to as a component object model (COM) system. Accordingly, the scripts executing on web server 1510 (and/or application 1512) invoke COM objects that implement the business logic. Further, server 1506 may utilize MICROSOFT'S TRANSACTION SERVER (MTS) to access required data stored in database 1516 via an interface such as ADO (Active Data Objects), OLE DB (Object Linking and Embedding DataBase), or ODBC (Open DataBase Connectivity).

Generally, these components 1500-1516 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the terms "user computer", "client computer", and/or "server computer" are referred to herein, it is understood that such computers 1502 and 1506 may be interchangeable and may further include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 1502 and 1506. Further, embodiments of the invention may be implemented as a software application on a client 1502 or server computer 1506. Further, as described above, the client 1502 or server computer 1506 may comprise a thin client device or a portable device that has a multi-touch-based display.

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer-implemented method for dynamically generating a digital building information model, comprising:
   (a) receiving design data for one or more architectural engineering and construction (AEC) designs;
   (b) encoding the design data for each of the AEC designs into a graph, wherein the encoding comprises a recognition process that analyzes the design data and produces a labeled representation of objects of the design data and relationships between the objects;
   (c) maintaining a knowledge base, wherein:
      (1) the knowledge base defines a model of design intent;
      (2) the knowledge base processes and stores the graph;
   (d) receiving first user input, wherein the first user input comprises a goal or a constraint for an AEC project;
   (e) generating, via the knowledge base, one or more solutions based on the first user input;
   (f) receiving second user input based on the one or more solutions;
   (g) training the knowledge base based on the second user input, wherein the knowledge base is iteratively trained; and
   (h) outputting the one or more solutions.

2. The computer-implemented method of claim 1, wherein the design data comprises goals and constraints for a construction project.

3. The computer-implemented method of claim 1, wherein the design data comprises a floor plan, a diagram, a detail drawing, a construction plan, a material takeoff, a cost estimation, a three-dimensional (3D) model, and performance data.

4. The computer-implemented method of claim 1, wherein:
   the design data comprises a dataset of previously developed AEC designs; and
   the knowledge base trains the model of design intent with patterns derived from the dataset.

5. The computer-implemented method of claim 4, further comprising:
   distributing the patterns to other users, wherein the distributed patterns are used as a base in a modeling system of the other users.

6. The computer-implemented method of claim 1, wherein the knowledge base, based on the graph, translates the second user input for new design projects into actionable design models, documentation, and analytical data.

7. The computer-implemented method of claim 1, wherein the graph comprises:
   nodes comprising the labeled representations of the objects; and
   links between the nodes represent the relationships between the objects.

8. The computer-implemented method of claim 1, wherein the graph comprises:
   a functional view, a geometry view, and a requirement view of the design data.

9. The computer-implemented method of claim 1, wherein the maintaining the knowledge base comprises:
   indexing design knowledge and allowing access and read/write activities;
   defining the model of design intent as an interactive model of a classification system; and
   providing an executable representation of knowledge from which cost is calculated.

10. The computer-implemented method of claim 1, wherein the one or more solutions comprise a calculated cost and timeline estimate for the AEC project.

11. A system for dynamically generating a digital building information model in computer system comprising:
    (a) a computer having a processor and a memory;
    (b) an application executed by the processor on the computer, wherein the application:
       (1) receives design data for one or more architectural engineering and construction (AEC) designs;
       (2) encodes the design data for each of the AEC designs into a graph, wherein the encoding comprises a recognition process that analyzes the design data and produces a labeled representation of objects of the design data and relationships between the objects;
       (3) maintains a knowledge base, wherein:
          (i) the knowledge base defines a model of design intent;
          (ii) the knowledge base processes and stores the graph;
       (4) receives first user input, wherein the first user input comprises a goal or a constraint for an AEC project;
       (5) generates, via the knowledge base, one or more solutions based on the first user input;
       (6) receives second user input based on the one or more solutions;
       (7) trains the knowledge base based on the second user input, wherein the knowledge base is iteratively trained; and
       (8) outputs the one or more solutions.

12. The computer-implemented system of claim 11, wherein the design data comprises goals and constraints for a construction project.

13. The computer-implemented system of claim 11, wherein the design data comprises a floor plan, a diagram, a detail drawing, a construction plan, a material takeoff, a cost estimation, a three-dimensional (3D) model, and performance data.

14. The computer-implemented system of claim 11, wherein:
   the design data comprises a dataset of previously developed AEC designs; and
   the knowledge base trains the model of design intent with patterns derived from the dataset.

15. The computer-implemented system of claim 14, wherein the application further:
   distributes the patterns to other users, wherein the distributed patterns are used as a base in a modeling system of the other users.

16. The computer-implemented system of claim 11, wherein the knowledge base, based on the graph, translates the second user input for new design projects into actionable design models, documentation, and analytical data.

17. The computer-implemented system of claim 11, wherein the graph comprises:
   nodes comprising the labeled representations of the objects; and
   links between the nodes represent the relationships between the objects.

18. The computer-implemented system of claim 11, wherein the graph comprises:
   a functional view, a geometry view, and a requirement view of the design data.

19. The computer-implemented system of claim 11, wherein the application maintains the knowledge base by:
   indexing design knowledge and allowing access and read/write activities;
   defining the model of design intent as an interactive model of a classification system; and
   providing an executable representation of knowledge from which cost is calculated.

20. The computer-implemented system of claim 11, wherein the one or more solutions comprise a calculated cost and timeline estimate for the AEC project.

\* \* \* \* \*